United States Patent
Li et al.

(10) Patent No.: US 10,048,540 B2
(45) Date of Patent: Aug. 14, 2018

(54) CONDUCTIVE ALIGNMENT LAYER, MANUFACTURE METHOD OF THE CONDUCTIVE ALIGNMENT LAYER, DISPLAY SUBSTRATE COMPRISING THE CONDUCTIVE ALIGNMENT LAYER, AND DISPLAY DEVICE

(71) Applicant: BOE TECHNOLOGY GROUP CO., LTD., Beijing (CN)

(72) Inventors: Wenbo Li, Beijing (CN); Chunyan Ji, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 171 days.

(21) Appl. No.: 14/437,132

(22) PCT Filed: Oct. 14, 2014

(86) PCT No.: PCT/CN2014/088584
§ 371 (c)(1),
(2) Date: Apr. 20, 2015

(87) PCT Pub. No.: WO2015/096537
PCT Pub. Date: Jul. 2, 2015

(65) Prior Publication Data
US 2016/0004125 A1    Jan. 7, 2016

(30) Foreign Application Priority Data
Dec. 27, 2013    (CN) .......................... 2013 1 0741661

(51) Int. Cl.
*G02F 1/1337* (2006.01)
*C09K 19/56* (2006.01)
(Continued)

(52) U.S. Cl.
CPC ........ *G02F 1/133711* (2013.01); *C09K 19/56* (2013.01); *G02F 1/133514* (2013.01);
(Continued)

(58) Field of Classification Search
None
See application file for complete search history.

(56) References Cited

U.S. PATENT DOCUMENTS 5,639,398 A * 6/1997 Rhee ...................... C09K 19/52
                                               252/299.01
6,753,047 B1   6/2004 Athey
(Continued)

FOREIGN PATENT DOCUMENTS

CN    1423759 A    6/2003
CN    1866064 A    11/2006
(Continued)

OTHER PUBLICATIONS

Chen et al. "Model of Liquid Crystal Alignment by Exposure to Linearly Polarized Ultraviolet Light" (1996). Physical Review E 54(2), pp. 1599-1603. Retrieved from http://digitalcommons.kent.edu/cpippubs/33. Copy attached as PDF.*

(Continued)

*Primary Examiner* — Katie L Hammer
(74) *Attorney, Agent, or Firm* — Ladas & Parry LLP; Loren K. Thompson

(57) ABSTRACT

Disclosed are a conductive alignment layer, a manufacture method of the conductive alignment layer, a display substrate comprising the conductive alignment layer and a display device which relate to the technology of LCD, simplify the manufacture method of conductive layer and alignment layer and also reduce the complexity in manufacturing a LCD device by preparing the conductive layer and the alignment layer in the substrate simultaneously (Continued)

through utilizing a material possessing both conductivity and alignment, without the need of preparing the conductive layer and the alignment layer separately.

12 Claims, 8 Drawing Sheets

(51) Int. Cl.
*G02F 1/1335* (2006.01)
*H05K 3/10* (2006.01)
*G03F 1/00* (2012.01)
*G03F 1/42* (2012.01)
*H05K 3/12* (2006.01)

(52) U.S. Cl.
CPC ............... *G03F 1/10* (2013.01); *G03F 1/106* (2013.01); *G03F 1/42* (2013.01); *H05K 3/10* (2013.01); *H05K 3/102* (2013.01); *G02F 1/133788* (2013.01); *G02F 2001/133796* (2013.01); *G02F 2202/36* (2013.01); *H05K 3/107* (2013.01); *H05K 3/12* (2013.01)

(56) References Cited

U.S. PATENT DOCUMENTS

| | | |
|---|---|---|
| 2002/0132065 A1 | 9/2002 | Saouani et al. |
| 2005/0196707 A1* | 9/2005 | Cok ...................... G03F 7/0007 430/318 |
| 2010/0045913 A1 | 2/2010 | Liu et al. |
| 2012/0224285 A1* | 9/2012 | Svasand .................. H01B 1/24 361/56 |
| 2012/0262653 A1* | 10/2012 | Shimizu ............ G02F 1/133707 349/106 |

FOREIGN PATENT DOCUMENTS

| | | |
|---|---|---|
| CN | 101575507 A | 11/2009 |
| CN | 101655620 A | 2/2010 |
| CN | 103293769 A | 9/2013 |
| CN | 103676331 A | 3/2014 |
| EP | 1921495 A1 | 5/2008 |
| JP | 2001-059908 A | 3/2001 |
| JP | 2013238717 A * | 11/2013 |
| TW | 200947072 A | 11/2009 |
| TW | 1356942 A | 1/2012 |

OTHER PUBLICATIONS

English text machine translation of Ando et al. (JP 2013-238717 A), accessed on the JPO AIPN website, copy attached as a PDF.*
First Chinese Office Action dated Sep. 2, 2015; Appln. No. 201310741661.5.
Second Chinese Office Action dated Jan. 27, 2016; Appln. No. 201310741661.5.
International Search Report Appln. No. PCT/CN2014/088584; dated Jan. 21, 2015.
Written Opinion of the International Searching Authority Appln. No. PCT/CN2014/088584; dated Jan. 21, 2015.

* cited by examiner

CONDUCTIVE ALIGNMENT LAYER, MANUFACTURE METHOD OF THE CONDUCTIVE ALIGNMENT LAYER, DISPLAY SUBSTRATE COMPRISING THE CONDUCTIVE ALIGNMENT LAYER, AND DISPLAY DEVICE

TECHNICAL FILED

Embodiments of the present invention relate to a conductive alignment layer, a manufacture method of the conductive alignment layer, a display substrate comprising the conductive alignment layer, and a display device.

BACKGROUND

Generally, a color filter (CF) substrate and an array substrate in a display panel of a Thin Film Transistor Liquid Crystal Display (TFT-LCD) both are provided with a conductive layer and an alignment layer formed by extremely complicated manufacture processes. As shown in FIG. 1, for the CF substrate, by way of example, a conductive layer 102 is disposed on a CF layer 101 and also can be regarded as being disposed on a common electrode if the CF layer 101 serves as the common electrode. By allowing the common electrode of the CF substrate to be corresponding to a pixel electrode (i.e., the conductive layer in the array substrate) of the array substrate, the CF substrate is electrically conducting with the array substrate. It's conventional to use a transparent conductive film made of ITO as the common electrode. However, the ITO has a fragile texture and is also liable to be detached from the CF layer due to its weak adhesion; at the meanwhile, it needs to perform sputtering at high temperature to prepare a transparent conductive film made of ITO, which may result in damage to the CF layer 101. Furthermore, during a manufacture process of an alignment layer 103 in the CF substrate, one of the conventional measures is to cause an alignment of a polyimide film (PI) by rubbing with cotton cloth or nylon cloth. However, a rubbing alignment process usually involves problem like uneven rubbing effect or occurrence of contaminated liquid crystals, etc.; moreover, in practice, the CF substrate is usually produced in advanced lines, while the rubbing alignment process usually requires the use of a friction roller which, in most cases, cannot work in the ordinary way in the advanced lines because of its large weight.

Thus it can be seen that the manufacture process of the conductive layer and of the alignment layer during producing a substrate is very complicated, which leads to relatively complicated manufacture process of LCD device.

SUMMARY

Embodiments of the present invention provide a conductive alignment layer, a manufacture method of the conductive alignment layer, a display substrate comprising the conductive alignment layer and a display device, in order to reduce the complexity in manufacturing a LCD device.

At least one embodiment of the present invention provides a conductive alignment layer comprising: a conductive material and an alignment material; or, a conductive alignment material. The conductive alignment layer is configured to possess both conductivity and alignment.

In an example, the conductive alignment layer further comprises a pigment to form a conductive alignment CF layer; wherein the conductive alignment CF layer is configured to possess conductivity, alignment and color rendering.

In an example, the conductive material is selected from a group consisted of carbon material, metal nanostructured material, conductive polymer material and organic conductive material.

In the example where the carbon material is used as the conductive material, the carbon material is selected from a group consisted of carbon nanotube, graphite and carbon black.

In an example, the alignment material is selected from a group consisted of photosensitive alignment molecule and surface-active agent; the photosensitive alignment molecule is selected from a group consisted of photoisomerized azobenzene group, photodimerized cinnamic acid ester, chalcone group, photodegraded cyclobutane dianhydride polyimide, polyimide, polyvinyl alcohol, polyacrylic resin and polysilane; the surface-active agent is selected from a group consisted of polyamide, octadecyl-malonic acid, benzoic acid derivatives, long-chain quaternary ammonium salt, pyridine salt and lecithos.

In an example, the conductive alignment material is selected from a group consisted of carbon nanotube, graphite and metal nanostructured material.

In an example, the pigment is selected from a group consisted of negative photoresist pigment and azo pigment.

At least one embodiment of the present invention further provides a display substrate comprising the conductive alignment layer as provided by embodiments of the present invention.

At least one embodiment of the present invention further provides a display device comprising an upper display substrate, a lower display substrate and a LC layer disposed between the upper display substrate and the lower display substrate; at least one of the upper display substrate and the lower display substrate is the display substrate as provided by embodiments of the present invention.

At least one embodiment of the present invention further provides a manufacture method of the conductive alignment layer as provided by embodiments of the present invention. The manufacture method comprises: mixing a pigment with a conductive material and an alignment material and coating the mixture as obtained onto a display substrate, or, coating a conductive alignment material onto a display substrate; and then exposing and curing the material as coated to form a conductive alignment layer.

In an example where a conductive alignment CF layer as provided by embodiments of the present invention is used as the conductive alignment layer, the manufacture method comprises: mixing a pigment with a conductive material and an alignment material or mixing a pigment with a conductive alignment material; coating the mixture as obtained onto a display substrate; exposing the mixture as coated by using linearly polarized UV-light, and then developing and curing the same to form a conductive alignment layer.

In an example, the manufacture method comprises: mixing a conductive material with a photosensitive alignment molecule; coating the mixture as obtained onto a display substrate; exposing the mixture of the conductive material and the photosensitive alignment molecule by using linearly polarized UV-light, and then developing and curing the same to form a conductive alignment layer.

In an example, the manufacture method comprises: mixing a conductive material with a surface-active agent and coating the mixture as obtained onto a display substrate; and then developing and curing the mixture as coated to form a conductive alignment layer.

In an example, the manufacture method comprises: coating a transparent conductive resin material containing a conductive alignment material onto a display substrate; applying an electric filed to the transparent conductive resin material before it's cured so as to cause a directional alignment of the conductive alignment material; and then developing and curing the transparent conductive resin material to form a conductive alignment layer.

In an example, the manufacture method comprises: covering a transparent, directional, conductive alignment material onto a display substrate; and then developing and curing the conductive alignment material to form a conductive alignment layer.

In an example, mixing a pigment with a conductive material and an alignment material comprises: doping a negative photoresist pigment with a conductive material and a photosensitive alignment molecule.

In an example, mixing a pigment with a conductive material and an alignment material comprises: chemically modifying a negative photoresist pigment by using a photosensitive alignment molecule, and then doping the chemically modified negative photoresist pigment with a conductive material.

In an example, mixing a pigment with a conductive material and an alignment material comprises: doping an azo pigment with a conductive material.

In an example, mixing a pigment with a conductive alignment material comprises: doping a conductive alignment material that has been modified by using a photosensitive alignment molecule with a negative photoresist pigment.

BRIEF DESCRIPTION OF THE DRAWINGS

Embodiments of the present invention will be described in more detail below with reference to the accompanying drawings to enable those skilled in the art to understand the present invention more clearly, wherein.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Figure 1:
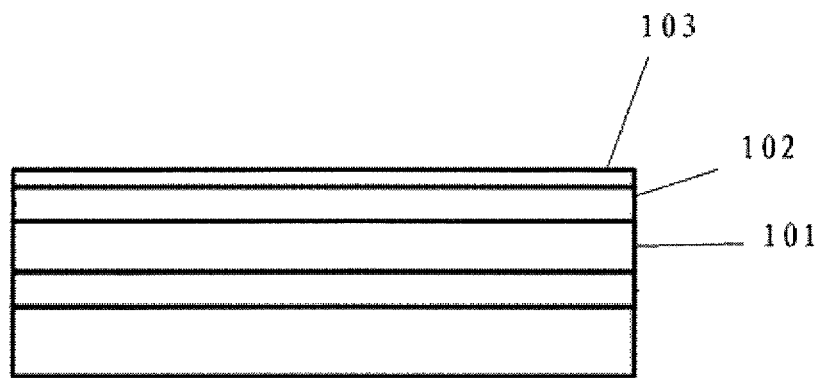
FIG. 1 is a structural view of a CF substrate as provided by exiting technology.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly. The applicant realized that a light transmittance of LC panel in the array substrate shown in FIG. 1 and FIG. 2 is not quite large due to the same voltage of common electrodes in the array substrate.

Embodiments of the present invention relate to technology of LC display, and provide a conductive alignment layer, a manufacture method of the conductive alignment layer, a display substrate and a display device; wherein a conductive layer and an alignment layer in a substrate are formed simultaneously by utilizing a material possessing both conductivity and alignment, without the need of preparing the conductive layer and the alignment layer in the substrate separately, which simplifies the manufacture process of the conductive layer and the alignment layer, and reduces the complexity in manufacturing a LCD device.

Figure 2:
FIG. 2 is a structural view of a conductive alignment layer as provided by an embodiment of the present invention.

FIG. 2 illustrates a conductive alignment layer as provided by an embodiment of the present invention, the conductive alignment layer comprises a conductive material 201 and an alignment material 202.

Figure 3:
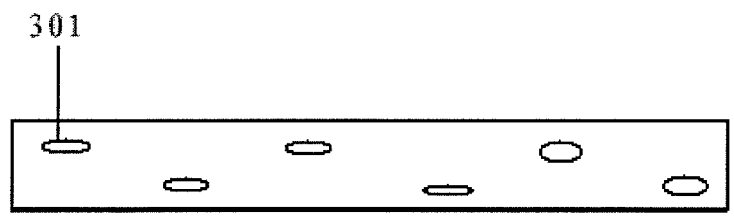
FIG. 3 is another structural view of a conductive alignment layer as provided by an embodiment of the present invention.

FIG. 3 illustrates a conductive alignment layer as provided by another embodiment of the present invention, the conductive alignment layer comprises a conductive alignment material 301.

The conductive alignment layer comprising a conductive material 201 and an alignment material 202 as shown in FIG. 2 and the conductive alignment layer comprising a conductive alignment material 301 as shown in FIG. 3 both possess conductivity and alignment at the same time. During manufacturing the substrate, it's no need to prepare the conductive layer and the alignment layer separately, so that the manufacture process of the substrate is simplified.

In an example, in order to satisfy the requirements of a substrate, for example, a CF substrate, the conductive alignment layer further comprises a pigment to form a conductive alignment CF layer; wherein the conductive alignment CF layer possesses conductivity, alignment and color rendering.

In an example, in order to provide better conductivity for the conductive alignment layer, the conductive material 201 can be any one of carbon material, metal nanostructured material, conductive polymer material and organic conductive material.

In an example where the carbon material is used as the conductive material 201, the carbon material can be any one of carbon nanotube, graphite and carbon black, for example, in order to provide better conductivity.

In an example, the alignment material 202 can be photosensitive alignment molecule or surface-active agent, for example, in order to provide better alignment for the conductive alignment layer.

In this example, the photosensitive alignment molecule can be any one of photoisomerized azobenzene group, photodimerized cinnamic acid ester, chalcone group, photodegraded cyclobutane dianhydride polyimide, polyimide, polyvinyl alcohol, polyacrylic resin and polysilane, for example.

In this example, the surface-active agent can be any one of polyamide, octadecyl-malonic acid, benzoic acid derivatives, long-chain quaternary ammonium salt, pyridine salt and lecithos, for example.

In an example, the conductive alignment material 301 can be any one of carbon nanotube, graphite and metal nanostructured material, for example, in order to provide better conductive alignment for the conductive alignment layer.

In an example, the pigment can be negative photoresist pigment or azo pigment, for example, in order to provide better color rendering for the conductive alignment layer.

Embodiments of the present invention further provide a display substrate comprising the conductive alignment layer as provided by embodiments of the present invention.

Embodiments of the present invention further provide a display device comprising an upper display substrate, a lower display substrate and a LC layer disposed between the upper display substrate and the lower display substrate; at least one of the upper display substrate and the lower display substrate is the display substrate as provided by embodiments of the present invention.

Figure 4:
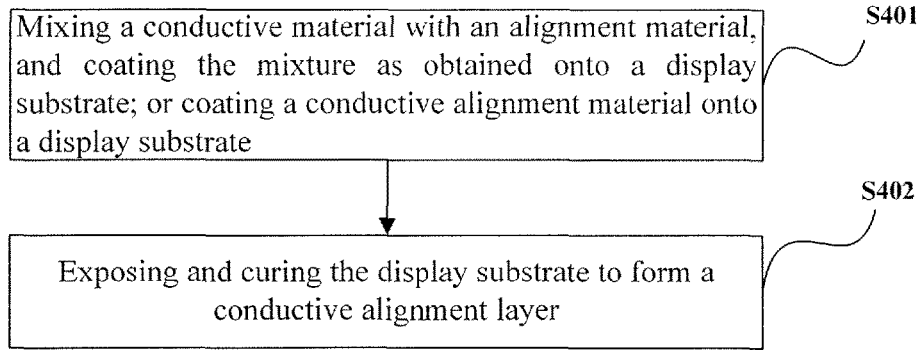
FIG. 4 is a flow chart of an exemplary manufacture method of the conductive alignment layer as provided by an embodiment of the present invention.

Embodiments of the present invention further provide a manufacture method of the conductive alignment layer as provided by embodiments of the present invention, for example, the conductive alignment layer described with reference to embodiments as shown in FIG. 2 or FIG. 3. FIG. 4 illustrate an embodiment of the manufacture method, comprising steps as below:

S401, mixing a conductive material 201 with an alignment material 202, and coating the mixture as obtained onto a display substrate; or coating a conductive alignment material 301 onto a display substrate.

S402, exposing and curing the display substrate to form a conductive alignment layer.

In an example where the conductive alignment layer is applied on a CF substrate, a CF layer is prepared at the same time with a conductive layer and an alignment layer, for example, so as to further facilitate the manufacture of the CF substrate.

Figure 5:
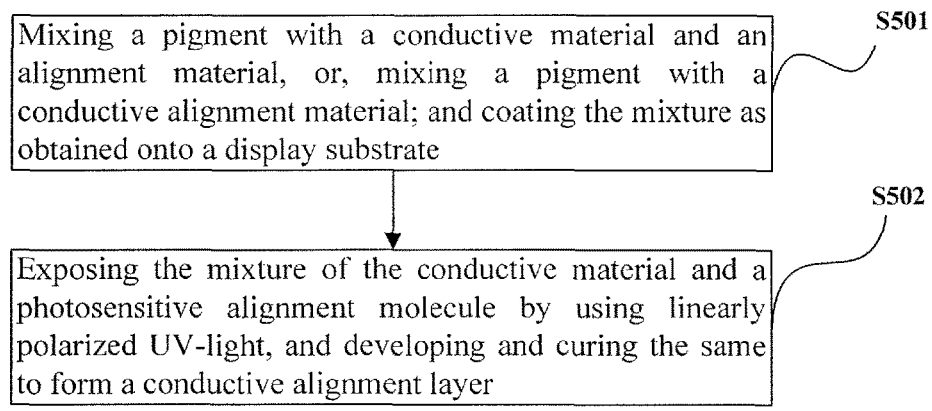
FIG. 5 is a flow chart of an exemplary manufacture method of conductive alignment layer as provided by an embodiment of the present invention.

As shown in FIG. 5, an embodiment of the manufacture method in which the CF layer, the conductive layer and the alignment layer are prepared at the same time comprises steps as below:

S501, mixing a pigment with a conductive material 201 and an alignment material 202, or, mixing a pigment with a conductive alignment material 301; and then coating the mixture as obtained onto a display substrate.

S502, exposing the mixture of the conductive material 201 and a photosensitive alignment molecule by using linearly polarized UV-light, and then developing and curing the same to form a conductive alignment layer.

In an example, preparing the conductive alignment layer comprises: mixing a conductive material 201 with a photosensitive alignment molecule; coating the mixture as obtained onto a display substrate; exposing the mixture of the conductive material 201 and photosensitive alignment molecule by using linearly polarized UV-light; and developing and curing the same to form a conductive alignment layer.

In an example, preparing the conductive alignment layer comprises: mixing a conductive material 201 with a surface-active agent; coating the mixture as obtained onto the display substrate; and developing and curing the mixture to form a conductive alignment layer.

In an example, preparing the conductive alignment layer comprises: coating a transparent conductive resin material containing a conductive alignment material 301 onto a display substrate; applying an electric filed before the transparent conductive resin material 301 is cured so as to directionally align the conductive alignment material 301; and then exposing and curing the transparent conductive resin material 301 to form a conductive alignment layer.

In an example, preparing the conductive alignment layer comprises: covering a display substrate with a transparent, directional, conductive alignment material 301; and then exposing and curing the conductive alignment material 301 to form a conductive alignment layer.

For example, in order to facilitate preparing the conductive alignment CF layer, mixing a conductive material 201 with an alignment material 202 comprises: doping a negative photoresist pigment with a conductive material 201 and a photosensitive alignment molecule; or chemically modifying a negative photoresist pigment by using a photosensitive alignment molecule and then doping the chemically modified negative photoresist pigment with a conductive material 201; or doping an azo pigment with a conductive material 201.

For example, in order to facilitate preparing the conductive alignment CF layer, mixing a pigment with a conductive alignment material 301 comprises: doping a conductive alignment material 301 that has been modified by using a photosensitive alignment molecule with a negative photoresist pigment.

Hereafter the conductive alignment layer, the manufacture method of the conductive alignment layer, the display substrate and the display device as provided by embodiments of the present invention will be described in details according to particular implementations thereof.

Figure 6:
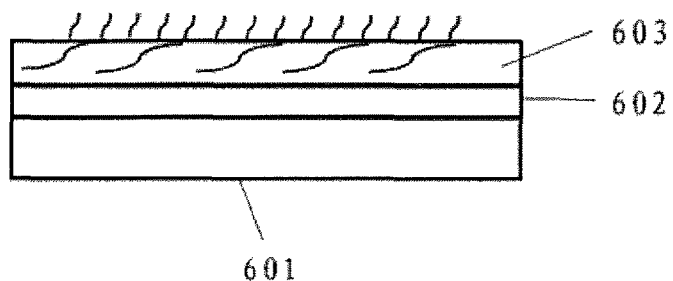
FIG. 6 is a structural view of a CF substrate as provided by an embodiment of the present invention.

FIG. 6 illustrates an embodiment of a CF substrate comprising the conductive alignment CF layer as provided by embodiments of the present invention, the CF substrate comprises: a glass substrate 601, a black matrix 602 located on the glass substrate 601 and a conductive alignment CF layer 603 covering a side of the glass substrate 601 having the black matrix 602. Wherein, the conductive alignment CF layer 603 possesses conductivity, alignment and color rendering.

The CF substrate comprises the conductive alignment CF layer 603 possessing conductivity, alignment and color rendering as provided by embodiments of the present invention, which reduces the complexity in manufacturing a LCD device using such CF substrate by incorporating the steps of preparing three film layers including the CF layer, the conductive layer and the alignment layer into one step of preparing only one film layer.

It requires an exposure process to prepare a CF substrate. Therefore, in an example, in order to facilitate preparing the conductive alignment layer 603, coating a negative photoresist pigment possessing both conductivity and photosensitive alignment onto a side of the glass substrate 601 having the black matric 602, exposing the negative photoresist pigment by using linearly polarized UV-light, and then developing and curing the same to form the conductive alignment CF layer 603.

For example, the negative photoresist pigment possessing both conductivity and photosensitive alignment can be any one of:

a negative photoresist pigment possessing both conductivity and photosensitive alignment prepared by doping a negative photoresist pigment with a conductive material 201 and a photosensitive alignment molecule;

a negative photoresist pigment possessing both conductivity and photosensitive alignment prepared by chemically modifying a negative photoresist pigment by using a photosensitive alignment molecule and then doping the chemically modified negative photoresist pigment with a conductive material 201;

a negative photoresist pigment possessing both conductivity and photosensitive alignment prepared by doping an azo pigment with a conductive material 201; and a negative photoresist pigment possessing both conductivity and photosensitive alignment prepared by doping a negative photoresist pigment with a carbon nanotube having been modified by using a photosensitive alignment molecule.

Wherein the negative photoresist pigment includes a red (R) negative photoresist pigment, a green (G) negative photoresist pigment and a blue (B) negative photoresist pigment. The negative photoresist pigment that is used in a liquid state can be prepared by dispersing a color resist for a certain color within a propylene resin or a epoxy resin which can be subject to hardening treatment (e.g., the color resist for R pigment is referred to as a R negative photoresist pigment). Wherein the color resist includes, for example, PVA with light-induced crosslinking or acrylic resin with optical overlapping.

In an example where the negative photoresist pigment possessing both conductivity and photosensitive alignment is prepared by chemically modifying a negative photoresist pigment by using a photosensitive alignment molecule and then doping the chemically modified negative photoresist pigment with a conductive material 201, it allows to generate a novel pigment macromolecule having high photosensitivity through an addition polymerization reaction of the photosensitive alignment molecule and a double bond of a polyfunctional monomer in a negative photoresist pigment molecule by means of a chemical modification to the negative photoresist pigment using the photosensitive alignment molecule. Under the exposure effect of the linearly polarized UV-light, a branch with a photosensitive functional group in the pigment macromolecule will occur an anisotropic photochemical reaction or a polymerization reaction or a decomposition reaction, while the remaining ones will be arranged in an uniform alignment so as to induce an alignment of the LC molecules by utilizing the stabilizing effect of the pigment macromolecule with respective to the LC molecules. In this case, the negative photoresist pigment possessing both conductivity and photosensitive alignment mainly contains a resin, a polyfunctional monomer, an initiator, a pigment, a dispersant, a solvent, an additive and a conductive material 201, etc.; wherein, for example, the initiator of 0.2%-0.6% is configured to quickly form a free radical or an ion active radical under light irradiation or heating; the pigment of 5%-8% is configured to adjust a color of the photoresist; the dispersant of about 5%-8% is configured to adjust the wetting and dispersing property of the pigment; the solvent of 70%-80% is configured to determine a viscosity for coating; the additive of 0.1%-0.2% is configured to allow the color resist forming ideal Newtonian fluid; and the conductive material takes 0.03%-2%. Doping the pigment with a conductive material such as carbon nanotube allows the cured pigment having certain conductive property. During coating the negative photoresist pigment possessing both conductivity and photosensitive alignment onto a side of the glass substrate 601 having the black matrix 602, only fewer solvent is considerably reduced due to a centrifugal force generated by the coating machine but the remaining components are hardly lost. The negative photoresist pigment can be doped with a polyfunctional monomer of 5%-8%, and the polyfunctional monomer is consisted of 3-6 functionalized PMMA monomers which will quickly react under light irradiation, as induced by the initiator, to form an interconnected network, so as to prevent from the corrosion of alkalescent solvent. At the same time, the functional group with a photosensitive alignment molecule structure is linked into a molecule structure of the polyfunctional monomer through chemical reaction so as to form a novel polyfunctional monomer having high photosensitivity, that is, a photosensitive branch; under exposure effect of the linearly polarized UV-light, the photosensitive functional group in the pigment macromolecule aligns in parallel with or perpendicular to the polarized light so as to induce an alignment of the LC molecules.

Figure 7:
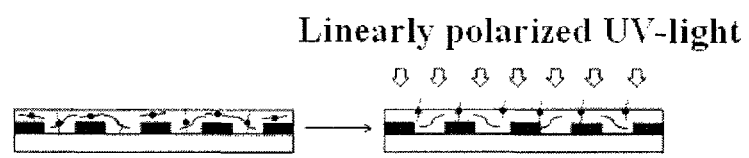
FIG. 7 illustrates an alignment of a pigment under exposure as provided by an embodiment of the present invention.

In an example where the negative photoresist pigment possessing both conductivity and photosensitive alignment is prepared by doping a negative photoresist pigment with a conductive material 201 and a photosensitive alignment molecule, the photosensitive alignment molecule is found free state in a pigment resin matrix to generate a photosensitive branch by adding the photosensitive alignment molecule into the pigment through physical doping, for example, by adding the photosensitive alignment molecule into a polyfunctional monomer at a rate of 2%-5% through physical doping. As shown in FIG. 7, under exposure effect of linearly polarized UV-light, photosensitive branches are aggregating, by phototactic movement, at a surface of the pigment along a direction in parallel with or perpendicular to the polarized light, so as to induce an alignment of the LC molecules.

In an example where the negative photoresist pigment possessing both conductivity and photosensitive alignment is prepared by doping an azo pigment with a conductive material 201, it can be achieved by directly using an azo dye such as R:PR254, G:PG36 and B: PB15 as the negative photoresist pigment. The LC molecules align in a direction perpendicular to the polarized light for irradiation.

In an example where the negative photoresist pigment possessing both conductivity and photosensitive alignment is prepared by doping a negative photoresist pigment with a carbon nanotube having been modified by using a photosensitive alignment molecule, the negative photoresist pigment is doped with a carbon nanotube having been modified by using a phototatic molecule and an electric filed is applied to the CF layer before the negative photoresist pigment is cured so as to cause a directional alignment of the internal carbon nanotube. Under light irradiation, carbon nanotubes will be concentrating at the surface of the CF layer by phototatic movement and form a long cylinder shape with directional alignment, thereby inducing an alignment of the LC molecules.

Of course, these embodiments are described herein by way of example only, those skilled in the art may prepare the negative photoresist pigment possessing both conductivity and photosensitive alignment by using other feasible manners of which the details will be omitted.

In an example, in order for the conductive material 201 to provide a better conductivity for the conductive alignment CF layer 603, the conductive material 201 can be selected from a group consisted of carbon material, metal nanostructured material, conductive polymer material and organic conductive material.

Of course, these materials are described herein by way of example only, those skilled in the art may use other feasible materials as the conductive material 201 of which the details will be omitted.

For example, the carbon material is selected from a group consisted of carbon nanotube, graphite and carbon black.

In an example where the carbon nanotube is used as the conductive material 201, the carbon nanotube can be contained in the negative photoresist pigment possessing both conductivity and photosensitive alignment at a rate of 0.02%-10%, for example, 0.03%-2%, in order to achieve better color rendering effect and conductive property of the negative photoresist pigment possessing both conductivity and photosensitive alignment. Besides, for example, the carbon nanotube can be, at first, modified with a functional group by grafting a functional group of the negative photoresist pigment to the carbon nanotube, so that the carbon nanotube and the negative photoresist pigment are blending with each other according to a principle of like dissolves like, in order to achieve better mixing effect.

In an example, depending on the type of anisotropic photoreaction, the photosensitive alignment molecule can be selected from a group consisted of photoisomerized azobenzene group, photodimerized cinnamic acid ester, chalcone group, and photodegraded cyclobutane dianhydride polyimide. Wherein an azo group structure in the photoisomerized azobenzene group is found of cis-trans aeolotropy property under irradiation of UV-light to control the LC molecules to arrange in homogeneous alignment and homeotropic alignment; in a photodimerized molecule of the photodimerized cinnamic acid ester, the number of branch parallel with the polarized light will be reduced due to photodimerization reaction of its double bond, thus the branch perpendicular to the polarized light controls an alignment of the LC molecules; for a photodegraded molecule, the molecule chain that is not perpendicular to a vibrating direction of the polarized light will be broken, while the molecule chain that is perpendicular to the vibrating direction is left to control an alignment of the LC molecules; besides, other molecules of polyimide, polyvinyl alcohol, polyacrylic resin and polysilane, etc. that have not been modified can also cause a homeotropic alignment through the photodimerization reaction.

Of course, these materials are described herein by way of example only, those skilled in the art may use other feasible materials as the photosensitive alignment molecule of which the details will be omitted.

In an embodiment of the present invention, a portion of the black matrix 602 is located in the CF layer in order to facilitate the conduction of electrodes and the electrically connection of surrounding circuits. In an example, the black matrix 602 is a conductive black matrix 602 made of a ferrous metal Cr, for example. In another example, the black matrix 602 is made of a conductive resin, for example; so as to achieve completely conducting with the CF layer through the conductive black matrix 602.

Figure 8:
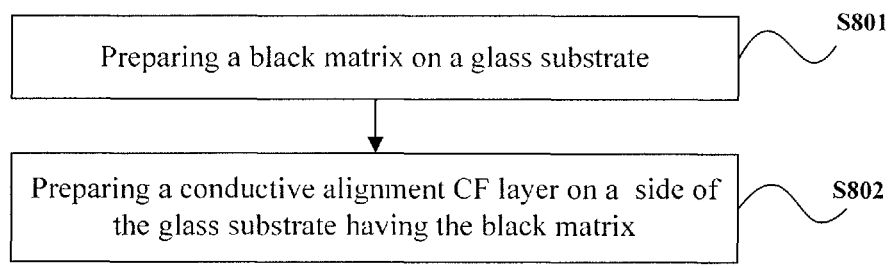
FIG. 8 is a flow chart of an exemplary manufacture method of CF substrate as provided by an embodiment of the present invention.

FIG. 8 illustrates a manufacture method of the CF substrate as provided by the embodiment of the present invention as shown in FIG. 6, comprising steps as below:

S801, preparing a black matrix 602 on a glass substrate 601;

S802, preparing a conductive alignment CF layer 603 on a side of the glass substrate 601 having the black matrix 602, wherein the conductive alignment CF layer 603 possesses conductivity, alignment and color rendering.

It requires an exposure process to prepare a CF layer. Therefore, in an example, coating a negative photoresist pigment possessing both conductivity and photosensitive alignment onto a side of the glass substrate 601 having the black matric 602, exposing the negative photoresist pigment by using linearly polarized UV-light, and then developing and curing the same to form the conductive alignment CF layer 603, in order to facilitate preparing the conductive alignment layer 603.

Figure 9:
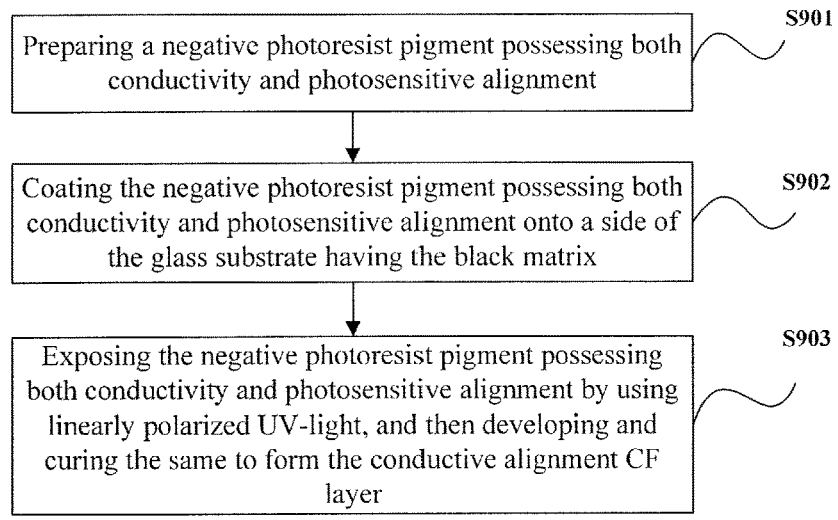
FIG. 9 is a flow chart of an exemplary manufacture method of conductive alignment CF layer as provided by an embodiment of the present invention.

In an example, as shown in FIG. 9, S802 comprises:

S901, preparing a negative photoresist pigment possessing both conductivity and photosensitive alignment;

S902, coating the negative photoresist pigment possessing both conductivity and photosensitive alignment onto a side of the glass substrate 601 having the black matrix 602;

S903, exposing the negative photoresist pigment possessing both conductivity and photosensitive alignment by using linearly polarized UV-light, and then developing and curing the same to form the conductive alignment CF layer 603; wherein the conductive alignment CF layer 603 possesses both conductivity and alignment.

In an example, S901 comprises:

doping a negative photoresist pigment with a conductive material 201 and a photosensitive alignment molecule to form a negative photoresist pigment possessing both conductivity and photosensitive alignment.

In an example, S901 comprises:
chemically modifying a negative photoresist pigment with a photosensitive alignment molecule, and then doping the chemically modified negative photoresist pigment with a conductive material 201 to form a negative photoresist pigment possessing both conductivity and photosensitive alignment.

In an example, S901 comprises:
doping an azo pigment with a conductive material 201 to form a negative photoresist pigment possessing both conductivity and photosensitive alignment.

In an example, S901 comprises:
doping a carbon nanotube that has been modified by using a photosensitive alignment molecule with a negative photoresist pigment to form a negative photoresist pigment possessing both conductivity and photosensitive alignment.

In an example, in order for the conductive 201 to provide better conductivity for the conductive alignment layer, the conductive material 201 can be selected from a group consisted of carbon material, metal nanostructured material, conductive polymer material and organic conductive material.

Of course, these materials are described herein by way of example only and those skilled in the art may use other feasible materials as the conductive material 201 of which the details will be omitted.

For example, the carbon material can be selected from a group consisted of carbon nanotube, graphite and carbon black.

In an example where the carbon nanotube is used as the conductive material 201, the carbon nanotube can be contained in the negative photoresist pigment possessing both conductivity and photosensitive alignment at a rate of 0.02%-10%, for example, 0.03%-2%, in order to achieve better color rendering effect and conductive property of the negative photoresist pigment possessing both conductivity and photosensitive alignment. Besides, for example, the carbon nanotube can be, at first, modified with a functional group by grafting a functional group of the negative photoresist pigment to the carbon nanotube, so that the carbon nanotube and the negative photoresist pigment are blending with each other according to a principle of like dissolves like, in order to achieve better mixing effect.

In an example, depending on the type of anisotropic photoreaction, the photosensitive alignment molecule can be selected from a group consisted of photoisomerized azobenzene group, photodimerized cinnamic acid ester, chalcone group, and photodegraded cyclobutane dianhydride polyimide. Wherein an azo group structure in the photoisomerized azobenzene group is found of cis-trans aeolotropy property under irradiation of UV-light to control the LC molecules to arrange in homogeneous alignment and homeotropic alignment; in a photodimerized molecule of the photodimerized cinnamic acid ester, the number of branch parallel with the polarized light will be reduced due to photodimerization reaction of its double bond, thus the branch perpendicular to the polarized light controls an alignment of the LC molecules; for a photodegraded molecule, the molecule chain that is not perpendicular to a vibrating direction of the polarized light will be broken, while the molecule chain that is perpendicular to the vibrating direction is left to control an alignment of the LC molecules; besides, other molecules of polyimide, polyvinyl alcohol, polyacrylic resin and polysilane, etc. that have not been modified can also cause a homeotropic alignment through the photodimerization reaction.

Of course, these materials are described herein by way of example only, those skilled in the art may use other feasible materials as the photosensitive alignment molecule of which the details will be omitted.

In an embodiment of the present invention, a portion of the black matrix 602 is located in the CF layer in order to facilitate the conduction of electrodes and the electrically connection of surrounding circuits. In an example, the black matrix 602 is a conductive black matrix 602 made of a ferrous metal Cr, for example. In another example, the black matrix 602 is made of a conductive resin, for example; so as to achieve completely conducting with the CF layer through the conductive black matrix 602.

Figure 10:
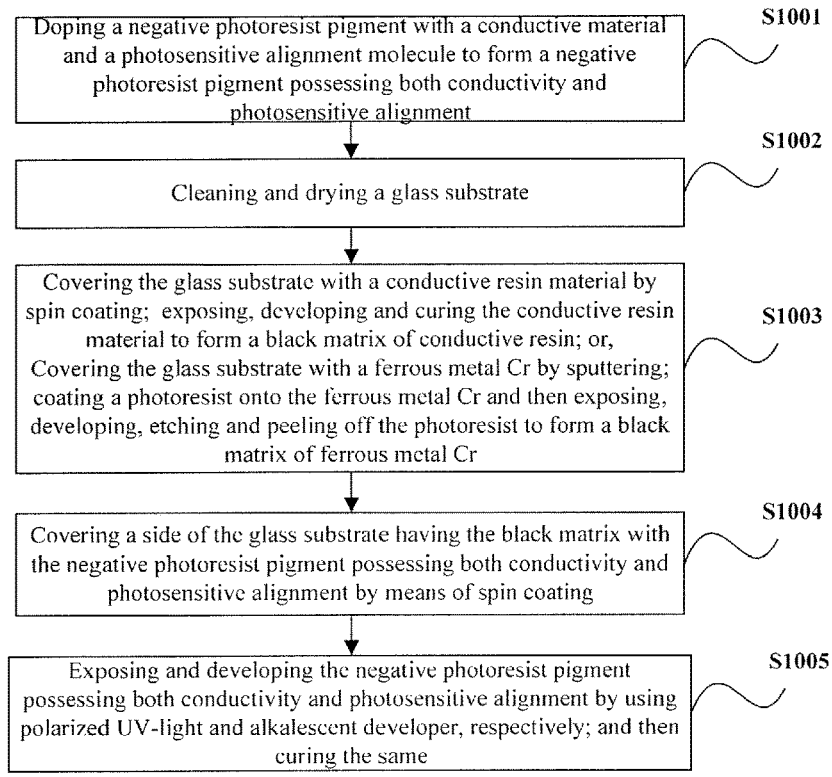
FIG. 10 is a flow chart of an exemplary manufacture method of CF substrate as provided by an embodiment of the present invention.

FIG. 10 illustrates a manufacture method of CF substrate as provided by the embodiment of the present invention, comprising steps as below:

S1001, doping a negative photoresist pigment with a conductive material 201 and a photosensitive alignment molecule to form a negative photoresist pigment possessing both conductivity and photosensitive alignment;

S1002, cleaning and drying a glass substrate 601;

S1003, covering the glass substrate 601 with a conductive resin material by means of spin coating; and then exposing, developing and curing the conductive resin material to form a black matrix 602 of conductive resin; or, covering the glass substrate 601 with a ferrous metal Cr by means of sputtering; coating a photoresist onto the ferrous metal Cr; and then exposing, developing, etching and peeling off the photoresist to form a black matrix 602 of ferrous metal Cr;

S1004, covering a side of the glass substrate 601 having the black matrix 602 with the negative photoresist pigment possessing both conductivity and photosensitive alignment by means of spin coating;

S1005, exposing and developing the negative photoresist pigment possessing both conductivity and photosensitive alignment by using polarized UV-light and alkalescent developer, respectively; and then curing the same.

It should be explained that the step of forming the negative photoresist pigment possessing both conductivity and photosensitive alignment is performed before others in the embodiment as shown in FIG. 10, although it can be performed simultaneously with S1002 and S1003 or performed between S1002 and S1003, or performed between S1003 and S1004 in other embodiments.

Figure 11:
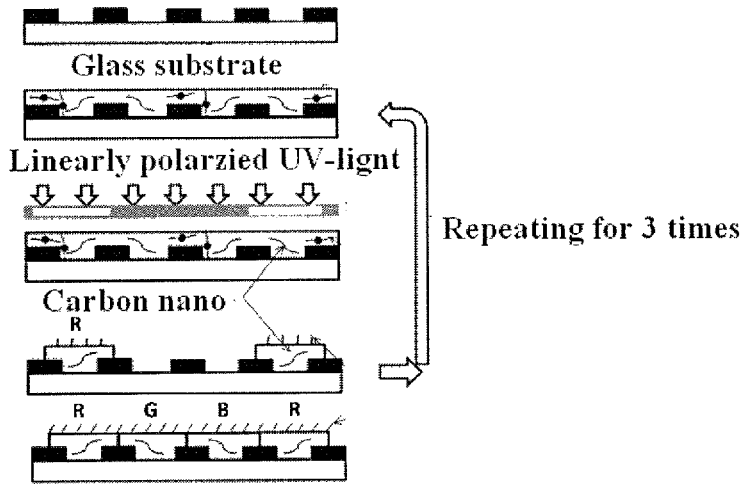
FIG. 11 is a schematic diagram of a manufacture method of CF substrate as provided by an embodiment of the present invention.

In an example, S1005 comprises: exposing, developing and curing an R negative photoresist possessing both conductivity and photosensitive alignment, a G negative photoresist possessing both conductivity and photosensitive alignment and a B negative photoresist possessing both conductivity and photosensitive alignment, respectively, to finish preparing R/G/B patterns possessing both conductivity and photosensitive alignment. For example, as shown in FIG. 11, at first, the R negative photoresist possessing both conductivity and photosensitive alignment as coated is exposed and developed, wherein the portion thereof subject to irradiation of polarized UV-light cannot be dissolved in the alkalescent developer, while the portion thereof that is not subject to irradiation of polarized UV-light cannot not be cured but can be dissolved in the alkalescent developer and hence washed away by the same; upon developing, the pattern of R layer as required is left; the above process can be repeated to obtain a pattern of G layer and a pattern of B layer. Wherein, a light-induced alignment of a RGB pigment possessing both conductivity and photosensitive alignment is occurred simultaneously with the exposure and development thereof because of the use of polarized UV-light.

It's necessary to use a negative photoresist pigment as the RGB pigment in embodiments of the present invention, because it has to add a photosensitive molecule into the RGB pigment and allow the RGB pigment to be subject to light irradiation in order to achieve a photosensitive alignment for preparing the conductive alignment CF layer; upon light irradiation, a portion of the negative RGB photoresist pigment that is subject to the light irradiation is left so as to achieve developing. Therefore, the use of negative photoresist pigment ensures that a curing process and a light-induced alignment process are performed at the same time for the RGB pigment with compatibility so as to facilitate the manufacture of the conductive alignment CF layer.

Figure 12:
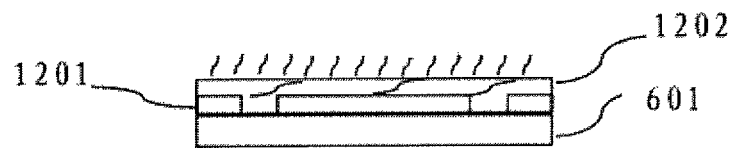
FIG. 12 is a structural view of an array substrate as provided by an embodiment of the present invention.

Embodiments of the present invention further provide an array substrate. FIG. 12 illustrates an example of such array substrate, comprising: a glass substrate 601, a TFT 1201 located on the glass substrate 601 and a conductive alignment layer 1202 covering a side of the glass substrate 601 having the TFT 1201; wherein the conductive alignment layer 1202 possesses both conductivity and alignment.

According to an embodiment of the present invention, the array substrate comprises a conductive alignment layer 1202 possessing both conductivity and alignment, which reduces the complexity in manufacturing a LCD device using such array substrate by incorporating the steps of preparing two film layers including the conductive layer and the alignment layer into one step of preparing only one film layer.

In an example, the conductive alignment layer 1202 is selected from a group consisted of:

a conductive alignment layer 1202 formed by coating a mixture of a conductive material 201 and a photosensitive alignment molecule onto a side of the glass substrate 601 having the TFT 1201, exposing the mixture of the conductive material 201 and the photosensitive alignment molecule by using linearly polarized UV-light, and then developing and curing the same;

a conductive alignment layer 1202 formed by coating a mixture of a conductive material 201 and a surface-active agent onto a side of the glass substrate 601 having the TFT 1201, and then developing and curing the mixture;

a conductive alignment layer 1202 formed by coating a transparent conductive resin material containing a one-dimensional conductive material 201 onto a side of the glass substrate 601 having the TFT 1201, applying an electric filed before the transparent conductive resin material is cured to allow a directional alignment of the one-dimensional conductive material 201, and then developing and curing the transparent conductive resin material; and a conductive alignment layer 1202 formed by covering a side of the glass substrate 601 having the TFT 1201 with a transparent, directional, conductive material 201, and then developing and curing the conductive material 201.

In an example where the conductive alignment layer 1202 is formed by coating a mixture of a conductive material 201 and a surface-active agent onto a side of the glass substrate 601 having the TFT 1201 and then developing and curing the mixture, it can be achieved, with carbon nanotube powder as the conductive material 201, through adding the carbon nanotube powder into the surface-active agent at a certain ratio to prepare colloidal sols of the carbon nanotube and then covering the glass substrate 601 with the colloidal sols by means of spin coating or spray coating to form a transparent conductive film.

When preparing an array substrate using such manufacture method, for example, if the CF substrate and the array substrate of the LCD device both control the liquid crystals to arrange in homeotropic alignment, it causes all the liquid crystals in the LC cell to arrange in homeotropic alignment; if the CF substrate of the LCD device controls the liquid crystals to arrange in homogeneous alignment while the array substrate of the LCD device controls the liquid crystals to arrange in homeotropic alignment, it causes all the liquid crystals in the LC cell to arrange in splay alignment.

In an example where the conductive alignment layer 1202 is formed by coating a transparent conductive resin material containing a one-dimensional conductive material 201 onto a side of the glass substrate 601 having the TFT 1201, applying an electric filed before the transparent conductive resin material is cured to cause a directional alignment of the one-dimensional conductive material 201 and then developing and curing the transparent conductive resin material, it can be achieved, with carbon nanotube as the one-dimensional conductive material 201, through coating a transparent conductive resin material containing carbon nanotube at a rate of 0.1%-0.5% by weight onto a side of the glass substrate 601 having the TFT 1201, applying an electric filed before the transparent resin material is cured to cause the disordered carbon nanotubes arranging in directional alignment so as to form micron-sized channels between adjacent tubes, and then controlling the liquid crystals to arrange in homogeneous alignment along a direction of the channel.

When preparing an array substrate using such manufacture method, for example, if the CF substrate and the array substrate of the LCD device both control the liquid crystals to arrange in homogeneous alignment, it can adjust the direction of the carbon nanotubes to cause the liquid crystals in the LC cell to arrange in twisted alignment; if the CF substrate of the LCD device controls the liquid crystals to arrange in homeotropic alignment while the array substrate of the LCD device controls the liquid crystals to arrange in homogeneous alignment, it causes all the liquid crystals in the LC cell to arrange in splay alignment.

In an example where the conductive alignment layer 1202 is formed by covering a side of the glass substrate 601 having the TFT 1201 with a transparent, directional, one-dimensional conductive material 201 and then developing and curing the conductive material 201, it can be achieved, with carbon nanotube as the one-dimensional conductive material 201, through directly using a transparent, directional, carbon nanotube film as both the conductive layer and the alignment layer, without the need of adding photosensitive molecules. In the carbon nanotube film, the raised nanotubes are arranged in homogeneous alignment and naturally form a plurality of channels parallel with each other with a width of 1-2 nm so as to induce the LC molecules to arrange along a direction of the channel.

When preparing an array substrate using such manufacture method, for example, if the CF substrate and the array substrate of the LCD device both control the liquid crystals to arrange in homogeneous alignment, it can adjust the direction of the carbon nanotubes to cause the liquid crystals in the LC cell to arrange in twisted alignment; if the CF substrate of the LCD device controls the liquid crystals to arrange in homeotropic alignment while the array substrate of the LCD device controls the liquid crystals to arrange in homogeneous alignment, it causes all the liquid crystals in the LC cell to arrange in splay alignment.

In an example, the conductive material 201 can be selected from a group consisted of carbon material, metal nanostructured material, conductive polymer material and organic conductive material, for example, in order for the conductive material 201 to provide better conductivity for the conductive alignment layer 1202.

In an example where the carbon material is used as the conductive material 201, the carbon material can be selected from a group consisted of carbon nanotube, graphite and carbon black, for example, in order to provide better conductivity.

In an example using a one-dimensional conductive material 201, the one-dimensional conductive material 201 can be selected from a group consisted of carbon nanotube and metal nanostructured material, for example, in order to provide better conductivity and alignment.

In an example, the photosensitive alignment molecule can be selected from a group consisted of photoisomerized azobenzene group, photodimerized cinnamic acid ester, chalcone group, photodegraded cyclobutane dianhydride polyimide, polyimide, polyvinyl alcohol, polyacrylic resin and polysilane, for example, in order to provide better photosensitive alignment for the conductive alignment layer 1202.

In an example, the surface-active agent can be selected from a group consisted of polyamide, octadecyl-malonic acid, benzoic acid derivatives, long-chain quaternary ammonium salt, pyridine salt and lecithos, for example, in order to provide better alignment for the conductive alignment layer 1202.

Of course, these embodiments are described herein by way of example only, those skilled in the art may use other feasible materials as the conductive material 201, the one-dimensional conductive material 201, the photosensitive alignment molecule or the surface-active agent of which the details will be omitted.

Figure 13:
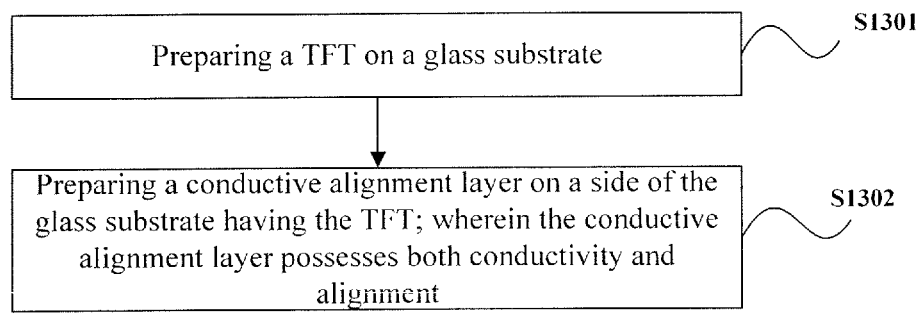
FIG. 13 is a flow chart of a manufacture method of array substrate as provided by an embodiment of the present invention.

Embodiments of the present invention further provide a manufacture method of the array substrate as provided by embodiments of the present invention, for example, the array substrate as shown in FIG. 12. FIG. 13 illustrates an embodiment of the manufacture method, comprising steps of:

S1301, preparing a TFT 1201 on a glass substrate 601;

S1302, preparing a conductive alignment layer 1202 on a side of the glass substrate 601 having the TFT 1201; wherein the conductive alignment layer 1202 possesses both conductivity and alignment.

In an example, S1302 comprises:

forming a conductive alignment layer 1202 by coating a mixture of a conductive material 201 and a photosensitive alignment molecule onto a side of the glass substrate 601 having the TFT 1201, exposing the mixture of the conductive material 201 and the photosensitive alignment molecule by using linearly polarized UV-light, and then developing and curing the same.

In an example, S1302 comprises:

forming a conductive alignment layer 1202 by coating a mixture of a conductive material 201 and a surface-active agent onto a side of the glass substrate 601 having the TFT 1201, and then developing and curing the mixture.

In an example, S1302 comprises:

forming a conductive alignment layer 1202 by coating a transparent conductive resin material containing a one-dimensional conductive material 201 onto a side of the glass substrate 601 having the TFT 1201, applying an electric filed before the transparent conductive resin material is cured to cause a directional alignment of the one-dimensional conductive material 201, and then developing and curing the transparent conductive resin material.

In an example, S1302 comprises:

forming a conductive alignment layer 1202 by covering a side of the glass substrate 601 having the TFT 1201 with a transparent, one-dimensional conductive material 201 having a directional alignment, and then developing and curing the conductive material 201.

For example, forming the conductive alignment layer 1202 by coating a mixture of a conductive material 201 and a surface-active agent onto a side of the glass substrate 601 having the TFT 1201 and then developing and curing the mixture can be achieved through adding carbon nanotube powder into the surface-active agent at a certain ratio to prepare colloidal sols of the carbon nanotube and then covering the glass substrate 601 with the colloidal sols by means of spin coating or spray coating to form a transparent conductive film. Wherein, the surface-active agent can be any material capable of inducing the LC molecules to arrange in homeotropic alignment, selected from a group consisted of polyamide, octadecyl-malonic acid, benzoic acid derivatives, long-chain quaternary ammonium salt, pyridine salt and lecithos.

When preparing an array substrate using such manufacture method, for example, if the CF substrate and the array substrate of the LCD device both control the liquid crystals to arrange in homeotropic alignment, it causes all the liquid crystals in the LC cell to arrange in homeotropic alignment; if the CF substrate of the LCD device controls the liquid crystals to arrange in homogeneous alignment while the array substrate of the LCD device controls the liquid crystals to arrange in homeotropic alignment, it causes all the liquid crystals in the LC cell to arrange in splay alignment.

In an example where the conductive alignment layer 1202 is formed by coating a transparent conductive resin material containing a one-dimensional conductive material 201 onto a side of the glass substrate 601 having the TFT 1201, applying an electric filed before the transparent conductive resin material is cured to cause a directional alignment of the one-dimensional conductive material 201 and then developing and curing the transparent conductive resin material, it can be achieved, with carbon nanotube as the one-dimensional conductive material 201, through coating a transparent conductive resin material containing carbon nanotubes at a rate of 0.1%45% by weight onto a side of the glass substrate 601 having the TFT 1201, applying an electric filed before the transparent resin material is cured to cause the disordered carbon nanotubes arranging in directional alignment so as to form micron-sized channels between adjacent tubes, and then controlling the liquid crystals to arrange in homogeneous alignment along a direction of the channel.

When preparing an array substrate using such manufacture method, for example, if the CF substrate and the array substrate of the LCD device both control the liquid crystals to arrange in homogeneous alignment, it can adjust the direction of the carbon nanotubes to cause the liquid crystals in the LC cell to arrange in twisted alignment; if the CF substrate of the LCD device controls the liquid crystals to arrange in homeotropic alignment while the array substrate of the LCD device controls the liquid crystals to arrange in homogeneous alignment, it causes all the liquid crystals in the LC cell to arrange in splay alignment.

Figure 14:
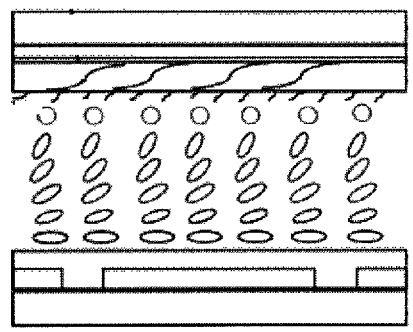
FIG. 14 illustrates an alignment of liquid crystals as provided by an embodiment of the present invention.

In an example where the conductive alignment layer 1202 is formed by covering a side of the glass substrate 601 having the TFT 1201 with a transparent, directional, one-dimensional conductive material 201 and then developing and curing the conductive material 201, it can be achieved, with carbon nanotube as the one-dimensional conductive material 201, through directly using a transparent, directional, carbon nanotube film as both the conductive layer and the alignment layer, without the need of adding photosensitive molecules. In the carbon nanotube film, the raised nanotubes are arranged in homogeneous alignment and naturally form a plurality of channels parallel with each other with a width of 1-2 nm so as to induce the LC molecules to arrange along a direction of the channel, as shown in FIG. 14.

When preparing an array substrate using such manufacture method, for example, if the CF substrate and the array substrate of the LCD device both control the liquid crystals to arrange in homogeneous alignment, it can adjust the direction of the carbon nanotubes to cause the liquid crystals in the LC cell to arrange in twisted alignment; if the CF substrate of the LCD device controls the liquid crystals to arrange in homeotropic alignment while the array substrate of the LCD device controls the liquid crystals to arrange in homogeneous alignment, it causes all the liquid crystals in the LC cell to arrange in splay alignment.

In an example, the conductive material 201 can be selected from a group consisted of carbon material, metal nanostructured material, conductive polymer material and organic conductive material, for example, in order for the conductive material 201 to provide better conductivity for the conductive alignment layer 1202.

In an example where the carbon material is used as the conductive material 201, the carbon material can be selected from a group consisted of carbon nanotube, graphite and carbon black, for example, in order to provide better conductivity.

In an example using a one-dimensional conductive material 201, the one-dimensional conductive material 201 can be selected from a group consisted of carbon nanotube and metal nanostructured material, for example, in order to provide better conductivity and alignment.

In an example, the photosensitive alignment molecule can be selected from a group consisted of photoisomerized azobenzene group, photodimerized cinnamic acid ester, chalcone group, photodegraded cyclobutane dianhydride polyimide, polyimide, polyvinyl alcohol, polyacrylic resin and polysilane, for example, in order to provide better photosensitive alignment for the conductive alignment layer 1202.

In an example, the surface-active agent can be selected from a group consisted of polyamide, octadecyl-malonic acid, benzoic acid derivatives, long-chain quaternary ammonium salt, pyridine salt and lecithos, for example, in order to provide better alignment for the conductive alignment layer 1202.

Of course, these embodiments are described herein by way of example only, those skilled in the art may use other feasible materials as the conductive material 201, the one-dimensional conductive material 201, the photosensitive alignment molecule or the surface-active agent of which the details will be omitted.

Figure 15:
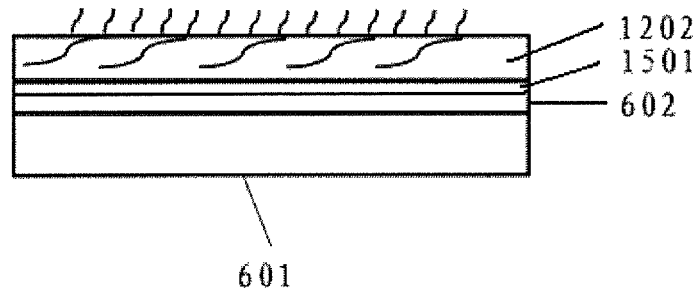
FIG. 15 is another structural view of a CF substrate as provided by an embodiment of the present invention.

Embodiments of the present invention further provide a CF substrate. FIG. 15 illustrates an embodiment of the CF substrate, comprising a glass substrate 601, a black matrix 602 located on the glass substrate 601, a CF layer 1501 covering a side of the glass substrate 601 having the black matrix 602 and a conductive alignment layer 1202 covering the CF layer 1501; wherein the conductive alignment layer 1202 possesses both conductivity and alignment.

The CF substrate comprises the conductive alignment layer 1202 possessing both conductivity and alignment as provided by embodiments of the present invention, which reduces the complexity in manufacturing a LCD device using such CF substrate by incorporating the steps of preparing two film layers including the conductive layer and the alignment layer into one step of preparing only one film layer.

In an example, the conductive alignment layer 1202 is selected from a group consisted of:

a conductive alignment layer 1202 formed by coating a mixture of a conductive material 201 and a photosensitive alignment molecule onto a CF layer 1501, exposing the mixture of the conductive material 201 and the photosensitive alignment molecule by using linearly polarized UV-light, and then developing and curing the same;

a conductive alignment layer 1202 formed by coating a mixture of a conductive material 201 and a surface-active agent onto a CF layer 1501, and then developing and curing the mixture;

a conductive alignment layer 1202 formed by coating a transparent conductive resin material containing a one-dimensional conductive material 201 onto a CF layer 1501, applying an electric filed before the transparent conductive resin material is cured to cause a directional alignment of the one-dimensional conductive material 201, and then developing and curing the transparent conductive resin material; and a conductive alignment layer 1202 formed by covering a CF layer 1501 with a transparent, directional, one-dimensional conductive material 201, and then developing and curing the conductive material 201.

Wherein, in an example where the conductive alignment layer 1202 is formed by coating a mixture of a conductive material 201 and a surface-active agent onto a CF layer 1501 and then developing and curing the mixture, it can be achieved, with carbon nanotube powder as the conductive material 201, through adding the carbon nanotube powder into the surface-active agent at a certain ratio to prepare colloidal sols of the carbon nanotube and then covering the glass substrate 601 with the colloidal sols by means of spin coating or spray coating to form a transparent conductive film.

In an example where the conductive alignment layer 1202 is formed by coating a transparent conductive resin material containing a one-dimensional conductive material 201 onto a CF layer 1501, applying an electric filed before the transparent conductive resin material is cured to cause a directional alignment of the one-dimensional conductive material 201 and then developing and curing the transparent conductive resin material, it can be achieved, with carbon nanotube as the one-dimensional conductive material 201, through coating a transparent conductive resin material containing carbon nanotubes at a rate of 0.1%-0.5% by weight onto the CF layer 1501, applying an electric filed before the transparent resin material is cured to cause the disordered carbon nanotubes arranging in directional alignment so as to form micron-sized channels between adjacent tubes, and then controlling the liquid crystals to arrange in homogeneous alignment along a direction of the channel.

In an example where the conductive alignment layer 1202 is formed by covering a CF layer 1501 with a transparent, directional, one-dimensional conductive material 201 and then developing and curing the conductive material 201, it can be achieved, with carbon nanotube as the one-dimensional conductive material 201, through directly using a transparent, directional, carbon nanotube film as both the conductive layer and the alignment layer, without the need of adding photosensitive molecules. In the carbon nanotube film, the raised nanotubes are arranged in homogeneous alignment and naturally form a plurality of channels parallel with each other with a width of 1-2 nm so as to induce the LC molecules to arrange along a direction of the channel.

In an example, the conductive material 201 can be selected from a group consisted of carbon material, metal nanostructured material, conductive polymer material and organic conductive material, for example, in order for the conductive material 201 to provide better conductivity for the conductive alignment layer 1202.

In an example where the carbon material is used as the conductive material 201, the carbon material can be selected from a group consisted of carbon nanotube, graphite and carbon black, for example, in order to provide better conductivity.

In an example using a one-dimensional conductive material 201, the one-dimensional conductive material 201 can be selected from a group consisted of carbon nanotube and metal nanostructured material, for example, in order to provide better conductivity and alignment.

In an example, the photosensitive alignment molecule can be selected from a group consisted of photoisomerized azobenzene group, photodimerized cinnamic acid ester, chalcone group, photodegraded cyclobutane dianhydride polyimide, polyimide, polyvinyl alcohol, polyacrylic resin and polysilane, for example, in order to provide better photosensitive alignment for the conductive alignment layer 1202.

In an example, the surface-active agent can be selected from a group consisted of polyamide, octadecyl-malonic acid, benzoic acid derivatives, long-chain quaternary ammonium salt, pyridine salt and lecithos, for example, in order to provide better alignment for the conductive alignment layer 1202.

Of course, these embodiments are described herein by way of example only and those skilled in the art may use other feasible materials as the conductive material 201, the one-dimensional conductive material 201, the photosensitive alignment molecule or the surface-active agent of which the details will be omitted.

Figure 16:
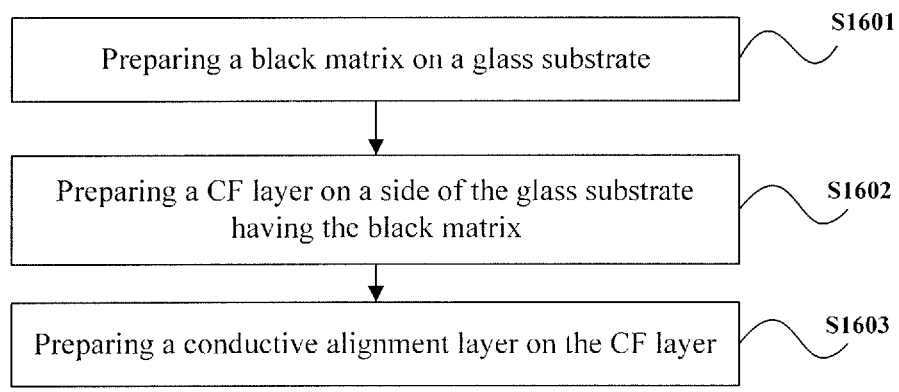
FIG. 16 is a flow chart of another exemplary manufacture method of CF substrate as provided by an embodiment of the present invention.

Embodiments of the present invention further provide a manufacture method of the CF substrate as provided by embodiments of the present invention, for example, the CF substrate as shown in FIG. 15. FIG. 16 illustrates an embodiment of the manufacture method, comprising steps as below:

S1601, preparing a black matrix 602 on a glass substrate 601;

S1602, preparing a CF layer 1501 on a side of the glass substrate 601 having the black matrix 602;

S1603, preparing a conductive alignment layer 1202 on the CF layer 1501, wherein the conductive alignment layer 1202 possesses both conductivity and alignment.

In an example, S1603 comprises:

forming a conductive alignment layer 1202 by coating a mixture of a conductive material 201 and a photosensitive alignment molecule onto the CF layer 1501, exposing the mixture of the conductive material 201 and the photosensitive alignment molecule by using linearly polarized UV-light, and then developing and curing the same.

In an example, S1603 comprises:

forming a conductive alignment layer 1202 by coating a mixture of a conductive material 201 and a surface-active agent onto the CF layer 1501, and then developing and curing the mixture.

In an example, S1603 comprises:

forming a conductive alignment layer 1202 by coating a transparent conductive resin material containing a one-dimensional conductive material 201 onto the CF layer 1501, applying an electric filed before the transparent conductive resin material is cured to cause a directional alignment of the one-dimensional conductive material 201, and then developing and curing the transparent conductive resin material.

In an example, S1603 comprises:

forming a conductive alignment layer 1202 by covering the CF layer 1501 with a transparent, directional, one-dimensional conductive material 201, and then developing and curing the conductive material 201.

For example, forming the conductive alignment layer 1202 by coating a mixture of a conductive material 201 and a surface-active agent onto the CF layer 1501 and then developing and curing the mixture can be achieved through adding carbon nanotube powder into the surface-active agent at a certain ratio to prepare colloidal sols of the carbon nanotube and then covering the glass substrate 601 with the colloidal sols by means of spin coating or spray coating to form a transparent conductive film. Wherein, the surface-active agent can be any material capable of inducing the LC molecules to arrange in homeotropic alignment, selected from a group consisted of polyamide, octadecyl-malonic acid, benzoic acid derivatives, long-chain quaternary ammonium salt, pyridine salt and lecithos.

In an example where the conductive alignment layer 1202 is formed by coating a transparent conductive resin material containing a one-dimensional conductive material 201 onto the CF layer 1501, applying an electric filed before the transparent conductive resin material is cured to cause a directional alignment of the one-dimensional conductive material 201 and then developing and curing the transparent conductive resin material, it can be achieved, with carbon nanotube as the one-dimensional conductive material 201, through coating a transparent conductive resin material containing carbon nanotubes at a rate of 0.1%-0.5% by weight onto the CF layer 1501, applying an electric filed before the transparent resin material is cured to cause the disordered carbon nanotubes arranging in directional alignment so as to form micron-sized channels between adjacent tubes, and then controlling the liquid crystals to arrange in homogeneous alignment along a direction of the channel.

When preparing a CF substrate using such manufacture method, for example, if the CF substrate and the array substrate of the LCD device both control the liquid crystals to arrange in homogeneous alignment, it can adjust the direction of the carbon nanotubes to cause the liquid crystals in the LC cell to arrange in twisted alignment; if the CF substrate of the LCD device controls the liquid crystals to arrange in homeotropic alignment while the array substrate of the LCD device controls the liquid crystals to arrange in homogeneous alignment, it causes all the liquid crystals in the LC cell to arrange in splay alignment.

In an example where the conductive alignment layer 1202 is formed by covering the CF layer 1501 with a transparent, directional, one-dimensional conductive material 201 and then developing and curing the conductive material 201, it can be achieved, with carbon nanotube as the one-dimensional conductive material 201, through directly using a transparent, directional, carbon nanotube film as both the conductive layer and the alignment layer, without the need of adding photosensitive molecules. In the carbon nanotube film, the raised nanotubes are arranged in homogeneous alignment and naturally form a plurality of channels parallel with each other with a width of 1-2 nm so as to induce the LC molecules to arrange along a direction of the channel.

When preparing a CF substrate using such manufacture method, for example, if the CF substrate and the array substrate of the LCD device both control the liquid crystals to arrange in homogeneous alignment, it can adjust the direction of the carbon nanotubes to cause the liquid crystals in the LC cell to arrange in twisted alignment; if the CF substrate of the LCD device controls the liquid crystals to arrange in homeotropic alignment while the array substrate of the LCD device controls the liquid crystals to arrange in homogeneous alignment, it causes all the liquid crystals in the LC cell to arrange in splay alignment.

In an example, the conductive material 201 can be selected from a group consisted of carbon material, metal nanostructured material, conductive polymer material and organic conductive material, for example, in order for the conductive material 201 to provide better conductivity for the conductive alignment layer 1202.

In an example where the carbon material is used as the conductive material 201, the carbon material can be selected from a group consisted of carbon nanotube, graphite and carbon black, for example, in order to provide better conductivity.

In an example using a one-dimensional conductive material 201, the one-dimensional conductive material 201 can be selected from a group consisted of carbon nanotube and metal nanostructured material, for example, in order to provide better conductivity and alignment.

In an example, the photosensitive alignment molecule can be selected from a group consisted of photoisomerized azobenzene group, photodimerized cinnamic acid ester, chalcone group, photodegraded cyclobutane dianhydride polyimide, polyimide, polyvinyl alcohol, polyacrylic resin and polysilane, for example, in order to provide better photosensitive alignment for the conductive alignment layer 1202.

In an example, the surface-active agent can be selected from a group consisted of polyamide, octadecyl-malonic acid, benzoic acid derivatives, long-chain quaternary ammonium salt, pyridine salt and lecithos, for example, in order to provide better alignment for the conductive alignment layer 1202.

Of course, these embodiments are described herein by way of example only, those skilled in the art may use other feasible materials as the conductive material 201, the one-dimensional conductive material 201, the photosensitive alignment molecule or the surface-active agent of which the details will be omitted.

Figure 17:
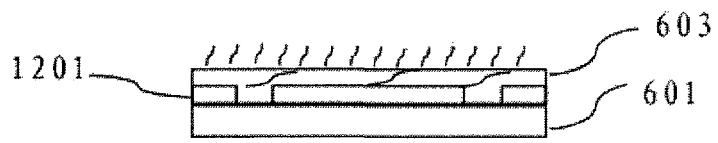
FIG. 17 is a structural view of an array substrate in an IPS-LCD device as provided by an embodiment of the present invention.

Embodiments of the present invention further provide an array substrate in an In-Plane-Switching Liquid Crystal Display (IPS-LCD) device. FIG. 17 illustrates an embodiment of the array substrate, comprising a TFT 1201 located on a glass substrate 601 and a conductive alignment CF layer 603 covering a side of the glass substrate 601 having the TFT 1201; wherein the conductive alignment CF layer 603 possesses conductivity, alignment and color rendering.

The CF substrate in IPS-LCD device comprises the conductive alignment CF layer 603 possessing conductivity, alignment and color rendering as provided by embodiments of the present invention, which reduces the complexity in manufacturing a IPS-LCD device using such CF substrate by incorporating the steps of preparing three film layers including the CF layer, the conductive layer and the alignment layer into one step of preparing only one film layer.

It requires an exposure process to prepare the CF layer 1501. Therefore, in an example, in order to facilitate preparing the conductive alignment layer 603, coating a negative photoresist pigment possessing both conductivity and photosensitive alignment onto a side of the glass substrate 601 having the TFT 1201, exposing the negative photoresist pigment by using linearly polarized UV-light, and then developing and curing the same to form the conductive alignment CF layer 603.

For example, the negative photoresist pigment possessing both conductivity and photosensitive alignment can be selected from a group consisted of:

a negative photoresist pigment possessing both conductivity and photosensitive alignment prepared by doping a negative photoresist pigment with a conductive material 201 and a photosensitive alignment molecule;

a negative photoresist pigment possessing both conductivity and photosensitive alignment prepared by chemically modifying a negative photoresist pigment with a photosensitive alignment molecule, and then doping the chemically modified negative photoresist pigment with a conductive material 201;

a negative photoresist pigment possessing both conductivity and photosensitive alignment prepared by doping an azo pigment with a conductive material 201; and, a negative photoresist pigment possessing both conductivity and photosensitive alignment prepared by doping a negative photoresist pigment with a carbon nanotube having been modified by using a photosensitive alignment molecule.

Wherein the negative photoresist pigment includes a red (R) negative photoresist pigment, a green (G) negative photoresist pigment and a blue (B) negative photoresist pigment. The negative photoresist pigment that is used in a liquid state can be prepared by dispersing a color resist for a certain color within a propylene resin or a epoxy resin which can be subject to hardening treatment (e.g., the color resist for R pigment is referred to as a R negative photoresist pigment). Wherein the color resist includes, for example, PVA with light-induced crosslinking or acrylic resin with optical overlapping.

In an example where the negative photoresist pigment possessing both conductivity and photosensitive alignment is prepared by chemically modifying a negative photoresist pigment by using a photosensitive alignment molecule and then doping the chemically modified negative photoresist pigment with a conductive material 201, it allows to generate a novel pigment macromolecule having high photosensitivity through an addition polymerization reaction of the photosensitive alignment molecule and a double bond of a polyfunctional monomer in a negative photoresist pigment molecule by means of a chemical modification to the negative photoresist pigment using the photosensitive alignment molecule. Under the exposure effect of the linearly polarized UV-light, a branch with a photosensitive functional group in the pigment macromolecule will occur an anisotropic photochemical reaction or a polymerization reaction or a decomposition reaction, while the remaining ones will be arranged in an uniform alignment so as to induce an alignment of the LC molecules by utilizing the stabilizing effect of the pigment macromolecule with respective to the LC molecules. In this case, the negative photoresist pigment possessing both conductivity and photosensitive alignment mainly contains a resin, a polyfunctional monomer, an initiator, a pigment, a dispersant, a solvent, an additive and a conductive material 201, etc.; wherein, for example, the initiator of 0.2%-0.6% is configured to quickly form a free radical or an ion active radical under light irradiation or heating; the pigment of 5%-8% is configured to adjust a color of the photoresist; the dispersant of about 5%-8% is configured to adjust the wetting and dispersing property of the pigment; the solvent of 70%-80% is configured to determine a viscosity for coating; the additive of 0.1%-0.2% is configured to allow the color resist forming ideal Newtonian fluid; and the conductive material takes 0.03%-2%. Doping the pigment with a conductive material such as carbon nanotube allows the cured pigment having certain conductive property. During coating the negative photoresist pigment possessing both conductivity and photosensitive alignment onto a side of the glass substrate 601 having the black matrix 602, only fewer solvent is considerably reduced due to a centrifugal force generated by the coating machine but the remaining components are hardly lost. The negative photoresist pigment can be doped with a polyfunctional monomer of 5%-8%, and the polyfunctional monomer is consisted of 3-6 functionalized PMMA monomers which will quickly react under light irradiation, as induced by the initiator, to form an interconnected network, so as to prevent from the corrosion of alkalescent solvent. At the same time, the functional group with a photosensitive alignment molecule structure is linked into a molecule structure of the polyfunctional monomer through chemical reaction so as to form a novel polyfunctional monomer having high photosensitivity, that is, a photosensitive branch; under exposure effect of the linearly polarized UV-light, the photosensitive functional group in the pigment macromolecule aligns in parallel with or perpendicular to the polarized light so as to induce an alignment of the LC molecules.

In an example where the negative photoresist pigment possessing both conductivity and photosensitive alignment is prepared by doping a negative photoresist pigment with a conductive material 201 and a photosensitive alignment molecule, the photosensitive alignment molecule is found free state in a pigment resin matrix to generate a photosensitive branch by adding the photosensitive alignment molecule into the pigment through physical doping, for example, by adding the photosensitive alignment molecule into a polyfunctional monomer at a rate of 2%-5% through physical doping. As shown in FIG. 7, under exposure effect of linearly polarized UV-light, photosensitive branches are aggregating, by phototactic movement, at a surface of the pigment along a direction in parallel with or perpendicular to the polarized light, so as to induce an alignment of the LC molecules.

In an example where the negative photoresist pigment possessing both conductivity and photosensitive alignment is prepared by doping an azo pigment with a conductive material 201, it can be achieved by directly using an azo dye such as R:PR254, G:PG36 and B: PB15 as the negative photoresist pigment. The LC molecules align in a direction perpendicular to the polarized light for irradiation.

In an example where the negative photoresist pigment possessing both conductivity and photosensitive alignment is prepared by doping a negative photoresist pigment with a carbon nanotube having been modified by using a photosensitive alignment molecule, the negative photoresist pigment is doped with a carbon nanotube having been modified by using a phototatic molecule and an electric filed is applied to the CF layer before the negative photoresist pigment is cured so as to cause a directional alignment of the internal carbon nanotube. Under light irradiation, the carbon nanotubes will be concentrating at the surface of the CF layer by phototatic movement and form a long cylinder shape with directional alignment, thereby inducing an alignment of the LC molecules.

Of course, these embodiments are described herein by way of example only, those skilled in the art may prepare the negative photoresist pigment possessing both conductivity and photosensitive alignment by other feasible methods of which the details will be omitted.

In an example, in order for the conductive material 201 to provide better conductivity for the conductive alignment CF layer 603, the conductive material 201 can be selected from a group consisted of carbon material, metal nanostructured material, conductive polymer material and organic conductive material.

Of course, these materials are described herein by way of example only and those skilled in the art may use other feasible materials as the conductive material 201 of which the details will be omitted.

For example, the carbon material is selected from a group consisted of carbon nanotube, graphite and carbon black.

In an example where the carbon nanotube is used as the conductive material 201, the carbon nanotube can be contained in the negative photoresist pigment possessing both conductivity and photosensitive alignment at a rate of 0.02%-10%, for example, 0.03%-2%, in order to achieve better color rendering effect and conductive property of the negative photoresist pigment possessing both conductivity and photosensitive alignment. Besides, for example, the carbon nanotube can be, at first, modified with a functional group by grafting a functional group of the negative photoresist pigment to the carbon nanotube, so that the carbon nanotube and the negative photoresist pigment are blending with each other according to a principle of like dissolves like, in order to achieve better mixing effect.

In an example, depending on the type of anisotropic photoreaction, the photosensitive alignment molecule can be selected from a group consisted of photoisomerized azobenzene group, photodimerized cinnamic acid ester, chalcone group, and photodegraded cyclobutane dianhydride polyimide. Wherein an azo group structure in the photoisomerized azobenzene group is found of cis-trans aeolotropy property under irradiation of UV-light to control the LC molecules to arrange in homogeneous alignment and homeotropic alignment; in a photodimerized molecule of the photodimerized cinnamic acid ester, the number of branch parallel with the polarized light will be reduced due to photodimerization reaction of its double bond, thus the branch perpendicular to the polarized light controls an alignment of the LC molecules; for a photodegraded molecule, the molecule chain that is not perpendicular to a vibrating direction of the polarized light will be broken, while the molecule chain that is perpendicular to the vibrating direction is left to control an alignment of the LC molecules; besides, other molecules of polyimide, polyvinyl alcohol, polyacrylic resin and polysilane, etc. that have not been modified can also cause a homeotropic alignment through the photodimerization reaction.

Of course, these materials are described herein by way of example only, those skilled in the art may use other feasible materials as the photosensitive alignment molecule of which the details will be omitted.

Figure 18:
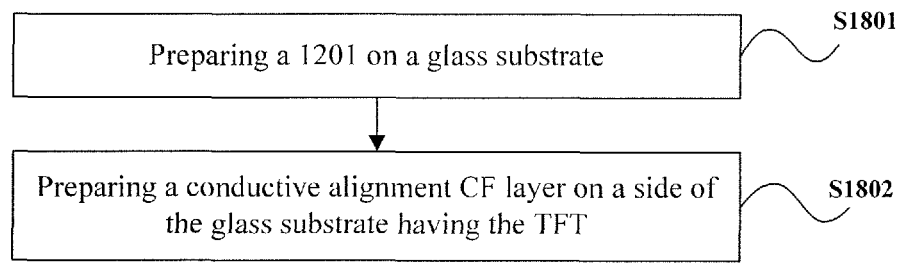
FIG. 18 is a flow chart of a manufacture method of array substrate in IPS-LCD device as provided by an embodiment of the present invention.

Embodiments of the present invention further provide a manufacture method of an array substrate in IPS-LCD device, for example, the array substrate as shown in FIG. 17. FIG. 18 illustrates an embodiment of the manufacture method, comprising steps as below:

S1801, preparing a TFT 1201 on a glass substrate 601;

S1802, preparing a conductive alignment CF layer 603 on a side of the glass substrate 601 having the TFT 1201; wherein the conductive alignment CF layer 603 possesses conductivity, alignment and color rendering.

It requires an exposure process to prepare the CF layer 1501. Therefore, in an example, in order to facilitate preparing the conductive alignment layer 603, coating a negative photoresist pigment having conductivity and photosensitive alignment onto a side of the glass substrate 601 having the TFT 1201, exposing the negative photoresist pigment by using linearly polarized UV-light, and then developing and curing the same to form the conductive alignment CF layer 603.

Figure 19:
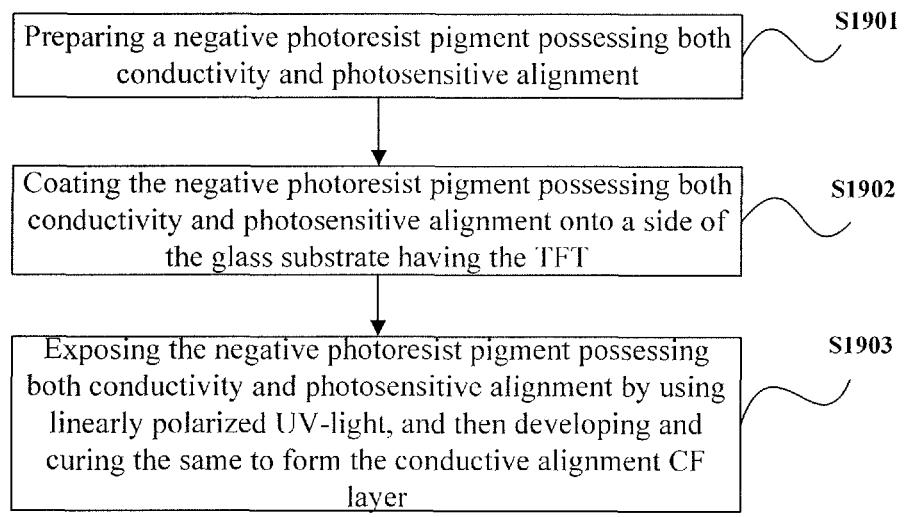
FIG. 19 is a flow chart of another exemplary manufacture method of conductive alignment CF layer as provided by an embodiment of the present invention.

In an example, as shown in FIG. 19, S1802 comprises:

S1901, preparing a negative photoresist pigment possessing both conductivity and photosensitive alignment;

S1902, coating the negative photoresist pigment possessing both conductivity and photosensitive alignment onto a side of the glass substrate 601 having the TFT 1201;

S1903, exposing the negative photoresist pigment possessing both conductivity and photosensitive alignment by using linearly polarized UV-light, and then developing and curing the same to form the conductive alignment CF layer 603.

In an example, S1901 comprises:

doping a negative photoresist pigment with a conductive material 201 and a photosensitive alignment molecule to form a negative photoresist pigment possessing both conductivity and photosensitive alignment.

In an example, S901 comprises:

chemically modifying a negative photoresist pigment by using a photosensitive alignment molecule, and then doping the chemically modified negative photoresist pigment with a conductive material 201 to form a negative photoresist pigment possessing both conductivity and photosensitive alignment.

In an example, S901 comprises:

doping an azo pigment with a conductive material 201 to form a negative photoresist pigment possessing both conductivity and photosensitive alignment.

In an example, S901 comprises:

doping a carbon nanotube that has been modified by using a photosensitive alignment molecule with a negative photoresist pigment to form a negative photoresist pigment possessing both conductivity and photosensitive alignment.

In an example, in order for the conductive 201 to provide better conductivity for the conductive alignment layer 1202, the conductive material 201 can be selected from a group consisted of carbon material, metal nanostructured material, conductive polymer material and organic conductive material.

Of course, these materials are described herein by way of example only, those skilled in the art may use other feasible materials as the conductive material 201 of which the details will be omitted.

For example, the carbon material can be selected from a group consisted of carbon nanotube, graphite and carbon black.

In an example where the carbon nanotube is used as the conductive material 201, the carbon nanotube can be contained in the negative photoresist pigment possessing both conductivity and photosensitive alignment at a rate of 0.02%-10%, for example, 0.03%-2%, in order to achieve better color rendering effect and conductive property of the negative photoresist pigment possessing both conductivity and photosensitive alignment. Besides, for example, the carbon nanotube can be, at first, modified with a functional group by grafting a functional group of the negative photoresist pigment to the carbon nanotube, so that the carbon nanotube and the negative photoresist pigment are blending with each other according to a principle of like dissolves like, in order to achieve better mixing effect.

In an example, depending on the type of anisotropic photoreaction, the photosensitive alignment molecule can be selected from a group consisted of photoisomerized azobenzene group, photodimerized cinnamic acid ester, chalcone group, and photodegraded cyclobutane dianhydride polyimide. Wherein an azo group structure in the photoisomerized azobenzene group is found of cis-trans aeolotropy property under irradiation of UV-light to control the LC molecules to arrange in homogeneous alignment and homeotropic alignment; in a photodimerized molecule of the photodimerized cinnamic acid ester, the number of branch parallel with the polarized light will be reduced due to photodimerization reaction of its double bond, thus the branch perpendicular to the polarized light controls an alignment of the LC molecules; for a photodegraded molecule, the molecule chain that is not perpendicular to a vibrating direction of the polarized light will be broken, while the molecule chain that is perpendicular to the vibrating direction is left to control an alignment of the LC molecules; besides, other molecules of polyimide, polyvinyl alcohol, polyacrylic resin and polysilane, etc. that have not been modified can also cause a homeotropic alignment through the photodimerization reaction.

Of course, these materials are described herein by way of example only, those skilled in the art may use other feasible materials as the photosensitive alignment molecule of which the details will be omitted.

Figure 20:
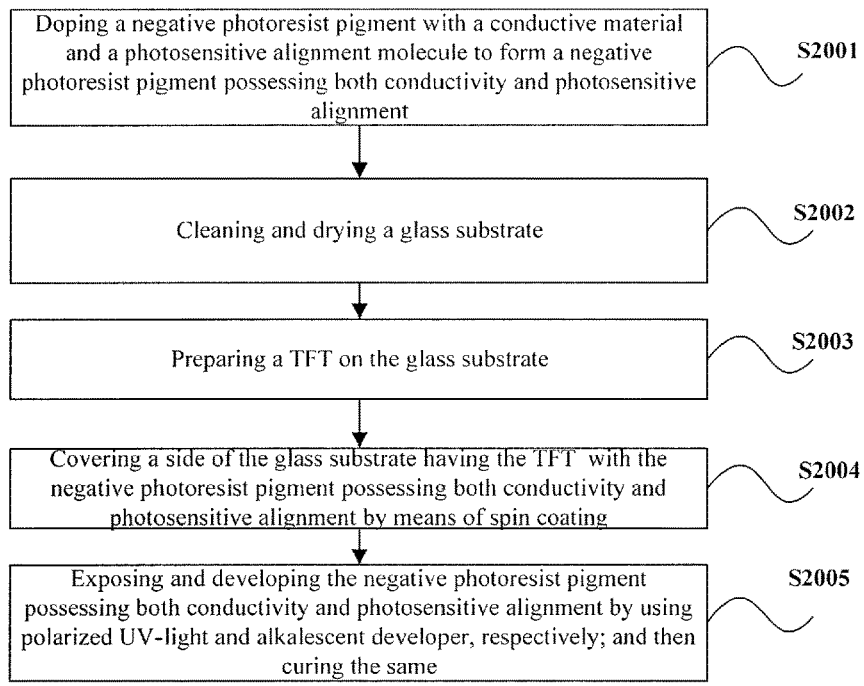
FIG. 20 is a flow chart of an exemplary manufacture method of array substrate in IPS-LCD device as provided by an embodiment of the present invention.

FIG. 20 illustrates another embodiment of the manufacture method of array substrate in IPS-LCD device as provided by embodiments of the present invention, comprising steps as below:

S2001, doping a negative photoresist pigment with a conductive material 201 and a photosensitive alignment molecule to form a negative photoresist pigment possessing both conductivity and photosensitive alignment;

S2002, cleaning and drying a glass substrate 601;

S2003, preparing a TFT 1201 on the glass substrate 601;

S2004, covering a side of the glass substrate 601 having the TFT 1201 with the negative photoresist pigment possessing both conductivity and photosensitive alignment by means of spin coating;

S2005, exposing and developing the negative photoresist pigment possessing both conductivity and photosensitive alignment by using polarized UV-light and alkalescent developer, respectively; and then curing the same.

In an example, S2005 comprises: exposing, developing and curing an R negative photoresist possessing both conductivity and photosensitive alignment, a G negative photoresist possessing both conductivity and photosensitive alignment and a B negative photoresist possessing both conductivity and photosensitive alignment, respectively, to finish preparing R/G/B patterns possessing both conductivity and photosensitive alignment. For example, at first, the R negative photoresist possessing both conductivity and photosensitive alignment as coated is exposed and developed, wherein the portion thereof subject to irradiation of polarized UV-light cannot be dissolved in the alkalescent developer, while the portion thereof that is not subject to irradiation of polarized UV-light cannot not be cured but can be dissolved in the alkalescent developer and hence washed away by the same; upon developing, the pattern of R layer as required is left; the above process can be repeated to obtain a pattern of G layer and a pattern of B layer. Wherein, a light-induced alignment of a RGB pigment possessing both conductivity and photosensitive alignment is occurred simultaneously with the exposure and development thereof because of the use of polarized UV-light.

Figure 21:
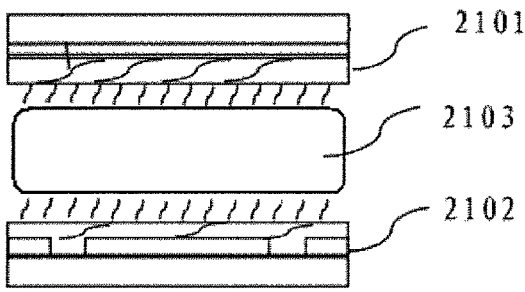
FIG. 21 is a structural view of a LCD device as provided by an embodiment of the present invention.

Embodiments of the present invention provided a LCD device. FIG. 21 illustrates an embodiment of the LCD device, comprising a CF substrate 2101, an array substrate 2102 and a LC layer 2103 disposed between the CF substrate 2101 and the array substrate 2102; wherein the CF substrate 2101 can be, for example, the CF substrate as provided by embodiments of the present invention as shown in FIG. 6 or FIG. 15, and corresponding structure and manufacture method thereof will be omitted herein.

In an example, the array substrate as provided by embodiments of the present invention, for example, the array substrate as manufactured with the method as shown in FIG. 12, can be used as the array substrate 2102 in the LCD device, in order to further simplify the manufacture method of the LCD device.

Figure 22:
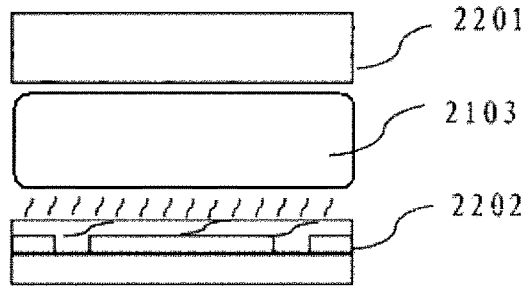
FIG. 22 is a structural view of an IPS-LCD device as provided by an embodiment of the present invention.

Embodiments of the present invention further provided an IPS-LCD device. FIG. 22 illustrates an embodiment of the IPS-LCD device, comprising an upper substrate 2201, a lower substrate 2202 and a LC layer 2103, wherein the array substrate in the IPS-LCD device as provided by embodiments of the present invention can be used as the lower substrate 2202.

In the IPS-LCD device as shown in FIG. 22, the black matrix 602 is disposed on the upper substrate 2201 in an example and is disposed on the lower substrate 2202 in another example.

At least one embodiment of the present invention provides a conductive alignment layer, a manufacture method of the conductive alignment layer, a display substrate comprising the conductive alignment layer and a display device which relate to the technology of LCD, simplify the manufacture method of conductive layer and alignment layer and also reduce the complexity in manufacturing a LCD device by preparing the conductive layer and the alignment layer in the substrate simultaneously through utilizing a material possessing both conductivity and alignment, without the need of preparing the conductive layer and the alignment layer separately.

What is claimed is:

1. A conductive alignment layer, comprising:
   a conductive material and an alignment material; and,
   wherein the conductive alignment layer is configured to possess both conductivity and alignment,
   wherein the alignment material is a photosensitive alignment molecule or a surface-active agent,
   the photosensitive alignment molecule is selected from the group consisted of photoisomerized azobenzene group, photodimerized cinnamic acid ester and chalcone group; and
   the surface-active agent is selected from the group consisted of polyamide, octadecyl-malonic acid, benzoic acid derivatives, long-chain quaternary ammonium salt, pyridine salt and lecithos.

2. The conductive alignment layer of claim 1, further comprising a pigment to form a conductive alignment color filter (CF) layer;
   wherein the conductive alignment CF layer is configured to possess conductivity, alignment and color rendering.

3. The conductive alignment layer of claim 1, wherein the conductive material is selected from a group consisting of carbon material, metal nanostructured material, conductive polymer material and organic conductive material.

4. The conductive alignment layer of claim 3, wherein the carbon material is selected from a group consisting of carbon nanotube, graphite and carbon black.

5. The conductive alignment layer of claim 2, wherein the pigment is a negative photoresist pigment or an azo pigment.

6. A display substrate, comprising the conductive alignment layer of claim 1.

7. A method for manufacturing the conductive alignment layer, comprising:
   mixing a conductive material with an alignment material and coating the mixture as obtained onto a display substrate; and
   developing and curing the mixing material as coated to form a conductive alignment layer,
   wherein the alignment material is a photosensitive alignment molecule or a surface- active agent, wherein
   the photosensitive alignment molecule is selected from the group consisted of photoisomerized azobenzene group, photodimerized cinnamic acid ester and chalcone group; and
   the surface-active agent is selected from the group consisted of polyamide, octadecyl-malonic acid, benzoic acid derivatives, long-chain quaternary ammonium salt, pyridine salt and lecithos.

8. A method for manufacturing the conductive alignment layer, comprising:
   mixing a pigment with a conductive material and an alignment material; and then coating the mixture as obtained onto a display substrate;
   exposing the mixture as coated by using linearly polarized UV-light, and developing and curing the same to form a conductive alignment layer,
   wherein the alignment material is a photosensitive alignment molecule or a surface-active agent, wherein
   the photosensitive alignment molecule is selected from the group consisted of photoisomerized azobenzene group, photodimerized cinnamic acid ester and chalcone group; and
   the surface-active agent is selected from the group consisted of polyamide, octadecyl-malonic acid, benzoic acid derivatives, long-chain quaternary ammonium salt, pyridine salt and lecithos.

9. The method of claim 7, wherein, the alignment material is a photosensitive alignment molecule, and before developing and curing the mixing material as coated to form a conductive alignment layer, the method further comprising:
   exposing the mixture of the conductive material and the photosensitive alignment molecule by using linearly polarized UV-light.

10. The method of claim 8, wherein, mixing a pigment with a conductive material and an alignment material comprises: doping a negative photoresist pigment with a conductive material and a photosensitive alignment molecule.

11. The method of claim 8, wherein, mixing a pigment with a conductive material and an alignment material comprises: chemically modifying a negative photoresist pigment by using a photosensitive alignment molecule, and then doping the chemically modified negative photoresist pigment with a conductive material.

12. The method of claim 8, wherein, mixing a pigment with a conductive material and an alignment material comprises: doping an azo pigment with a conductive material.

* * * * *